United States Patent
Imai

(10) Patent No.: US 8,119,973 B2
(45) Date of Patent: Feb. 21, 2012

(54) LIGHT RECEIVING CIRCUIT

(75) Inventor: Hitoshi Imai, Kawasaki (JP)

(73) Assignee: Renesas Electronics Corporation, Kawasaki-Shi (JP)

( * ) Notice: Subject to any disclaimer, the term of this patent is extended or adjusted under 35 U.S.C. 154(b) by 0 days.

(21) Appl. No.: 12/768,261

(22) Filed: Apr. 27, 2010

(65) Prior Publication Data

US 2010/0271077 A1  Oct. 28, 2010

(30) Foreign Application Priority Data

Apr. 28, 2009 (JP) ................. 2009-109619

(51) Int. Cl.
*H01J 40/14* (2006.01)
*H03F 3/08* (2006.01)

(52) U.S. Cl. ................. 250/214 R; 250/214 A; 330/308

(58) Field of Classification Search .............. 250/214 A, 250/214 LA, 214 S, 214 LS, 214 R, 214.1, 250/551, 214 SW, 214 AG, 214 C; 330/85, 330/110, 308, 59; 327/311, 103, 307, 323, 327/543

See application file for complete search history.

(56) References Cited

U.S. PATENT DOCUMENTS

| | | | | |
|---|---|---|---|---|
| 5,123,732 A | * | 6/1992 | Gross et al. | 356/73.1 |
| 5,483,170 A | * | 1/1996 | Beasley et al. | 324/537 |
| 5,491,548 A | * | 2/1996 | Bell et al. | 356/73.1 |
| 2001/0003047 A1 | * | 6/2001 | Yamaguchi et al. | 438/1 |
| 2006/0071686 A1 | * | 4/2006 | Chang | 326/68 |

FOREIGN PATENT DOCUMENTS

JP  2007-110021 A  4/2007

* cited by examiner

*Primary Examiner* — Georgia Y Epps
*Assistant Examiner* — Don Williams
(74) *Attorney, Agent, or Firm* — Sughrue Mion, PLLC

(57) ABSTRACT

A light receiving circuit in accordance with an exemplary aspect of the present invention includes a photodiode 6 that converts an optical input signal into a current signal, and an I-V conversion circuit 8 that converts the current signal into a voltage signal. The light receiving circuit further includes a transient current processing circuit 21 that process a transient current from the I-V conversion amplifier 8 when the I-V conversion amplifier 8 is changed from an operating state to a non-operating state, and a clipping circuit 24 that keeps the voltage of the input terminal of the transient current processing circuit 21 at a predetermined value.

7 Claims, 6 Drawing Sheets

LIGHT RECEIVING CIRCUIT

INCORPORATION BY REFERENCE

This application is based upon and claims the benefit of priority from Japanese patent application No. 2009-109619, filed on Apr. 28, 2009, the disclosure of which is incorporated herein in its entirety by reference.

BACKGROUND OF THE INVENTION

1. Field of the Invention

The present invention relates to a light receiving circuit.

2. Description of Related Art

In recent years, optical disk drive devices capable of recording/reproducing data using optical disk media such as CDs/DVDs have become widespread. A light receiving IC provided in the pick-up unit of such optical disk drive devices has functions of converting a laser light reflected from a disk into an electrical current by using a light-sensitive element, and of converting the converted electrical current into a voltage by using an I-V conversion amplifier.

Note that the intensity of light input to the light receiving IC changes depending on the operating situation due to the difference in the intensity of laser output according to recording/reproducing operations and the difference in the reflectivity from one optical disk medium to another. Therefore, to cope with recording/reproducing operations of various optical disks, it is necessary to switch the I-V conversion gain according to the intensity of input light. That is, the light receiving IC needs to be equipped with a function of switching an I-V gain. Further, as a gain switching characteristic, such switching needs to be performed in a short time and with stability, for example, for data/address verifications at the time of disk recording.

Such light receiving circuit having an I-V conversion gain switching function is disclosed in Japanese Unexamined Patent Application Publication No. 2007-110021, for example. The technique disclosed in Japanese Unexamined Patent Application Publication No. 2007-110021 is referred to as Publicly-known technique 1 hereinafter. FIG. 5 is a circuit diagram showing a configuration of a light receiving circuit disclosed in Publicly-known technique 1. Note that FIG. 5 shows only a part of a light receiving circuit related to the present invention.

As shown in FIG. 5, two I-V conversion amplifiers 8 and 9 having different I-V conversion gains are provided for one photodiode 6. Power-supply voltage terminals 1, 2 and 3 are connected to the I-V conversion amplifiers 8 and 9. A power-supply voltage Vcc, a ground voltage GND, and a reference voltage Vref are supplied through the power-supply voltage terminals 1, 2 and 3 respectively. Further, a bias terminal 4 is connected to the I-V conversion amplifier 8. Meanwhile, a bias terminal 5 is connected to the I-V conversion amplifier 9. Then, by selectively turning on the bias terminal 4 or 5 corresponding to the I-V conversion amplifier 8 or 9 that has a desired I-V conversion gain, the gain switching between the I-V conversion amplifiers 8 and 9 is implemented. Further, a voltage converted with the desired I-V conversion gain is output from an output terminal 10.

However, the following problem arises in the light receiving circuit of Publicly-known technique 1. To switch the I-V conversion amplifier in a short time and with stability, it is necessary that a transistor(s) constituting the I-V conversion amplifier on the turning-off side should be turned off swiftly without having any effect on the I-V conversion amplifier on the turning-on side. The light receiving circuit of Publicly-known technique 1 includes a typical output stage circuit having a current mirror configuration including transistors that are driven by a non-constant current like the transistors Q1_3 and Q2_3. Therefore, the transient current that is generated at the time of turning off is not processed swiftly, and has an adverse effect on the output characteristics of the I-V conversion amplifier on the turning-on side. As a result, excellent switching characteristics cannot be obtained.

As a specific example, a case where the bias terminal 4 is changed from an Off-state to an On-state and the bias terminal 5 is changed from an On-state to an Off-state in FIG. 5 is explained hereinafter. That is, an operation at the moment at which the I-V conversion amplifier 8 is changed from an Off-state to an On-state and the I-V conversion amplifier 9 is changed from an On-state to an Off-state is explained.

The transistors Q2_2 and Q2_3 form a current mirror configuration. Therefore, when the bias terminal 5 is in an Off-state, the transistor Q2_2 is turned off. As a result, the transistor Q2_3 is also turned off. The transistor Q2_3 needs to be turned off swiftly at the time of switching between the I-V conversion amplifiers 8 and 9. However, since the transistor Q2_4 is turned off at the same time, the transient current from the collector of the transistor Q2_3 is processed as the base current of the transistor Q2_5. Therefore, the transistor Q2_3 cannot be swiftly turned off. Further, since the transistor Q2_6 is in an Off-state, the emitter current of the transistor Q2_5 that is generated by this transient current of the transistor Q2_3 affects the I-V conversion amplifier 8 through the feedback resistor R2_1. Further, depending on the presence/absence of a light input current 7, one of the following phenomena occurs.

(1) Light input current 7 is present

Since the emitter current of the transistor Q2_5 transiently reduces the light input current 7 to the I-V conversion amplifier 8, an abnormal output is observed at the output terminal 10. FIG. 2 shows an output waveform from the output terminal 10 at the time of switching between the I-V conversion amplifiers. As indicated by a dashed-dotted line in FIG. 2, the Vout waveform (output waveform) has a blunted shape.

(2) Light input current 7 is absent

The emitter current of the transistor Q2_5 flows to the transistor Q1_6 of the output stage circuit of the I-V conversion amplifier 8 through the feedback resistor R1_1. That is, a current path is formed from the emitter of the transistor Q2_5 to the transistor Q1_6 through the feedback resistor R1_1, and an abnormal output is thereby observed at the output terminal 10.

It is conceivable that a constant current circuit may be added, for example, as shown in FIG. 6 in order to process the transient current that is generated when the transistors Q1_3 and Q2_3 are turned off as described above. The technique like this is referred to as Publicly-known technique 2 hereinafter. FIG. 6 is a circuit diagram showing a configuration of a light receiving circuit disclosed in Publicly-known technique 2.

FIG. 6 shows a light receiving circuit in which two additional transistors Q1_7 and Q2_7 are added in the light receiving circuit shown in FIG. 5. Further, the collector of the transistor Q1_7 is connected to the collector of the transistor Q2_3, and the base of the transistor Q1_7 is connected to the bias terminal 4. Furthermore, the collector of the transistor Q2_7 is connected to the collector of the transistor Q1_3, and the base of the transistor Q2_7 is connected to the bias terminal 5. In this way, the transient current, which is generated when the transistors Q1_3 and Q2_3 are turned off and which is the origin of the above-mentioned problem, is processed.

As a specific example, a case where the bias terminal 4 is changed from an Off-state to an On-state and the bias terminal 5 is changed from an On-state to an Off-state in FIG. 6 is explained hereinafter. That is, an operation in the case in which the I-V conversion amplifier 8 is changed from an Off-state to an On-state and the I-V conversion amplifier 9 is changed from an On-state to an Off-state is explained. As with the case explained above, the transient current is generated when the transistor Q2_3 is turned off. This transient current can be processed by operating the constant current circuit by the transistor Q1_7 by using the bias terminal 4, which is the bias on the turning-on side. However, another problem described below arises.

After the constant current circuit of the transistor Q1_7 has processed the whole transient current of the transistor Q2_3, it continues to operate with a constant current in a state where no current can be supplied from the collector side. Therefore, it begins the saturation region operation of the transistor in which a current is drawn from the base side. As a result, the collector potential of the transistor Q1_7, i.e., the collector potential of the transistor Q2_3 falls to or below the base potential of the transistor Q1_7. When the I-V conversion amplifier 9 is changed from the Off-state to an On-state in this state, the collector potential of the transistor Q2_3 needs to return to the operating potential from this lowered potential state, and thereby causing an abnormal waveform. A specific output waveform of this behavior is indicated by a dotted line in FIG. 2. As shown in FIG. 2, although the blunted shape of the waveform at the time of switching between the I-V conversion amplifiers in Publicly-known technique 1 is alleviated, a groove-shaped abnormality occurs in the waveform.

SUMMARY

A first exemplary aspect of the present invention is a light receiving circuit including: a light-sensitive element that converts an optical input signal into a current signal; a first current-voltage conversion circuit that converts the current signal to a voltage signal; a first transient current processing circuit that processes a transient current from the first current-voltage conversion circuit when the first current-voltage conversion circuit is switched from an operating state to a non-operating state; and a first clipping circuit that keeps a voltage of an input terminal of the first transient current processing circuit at a predetermined value. In this way, improved output characteristics can be obtained.

In accordance with an exemplary aspect of the present invention, a light receiving circuit having improved output characteristics can be provided.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE EXEMPLARY EMBODIMENTS

First Exemplary Embodiment

Figure 1:
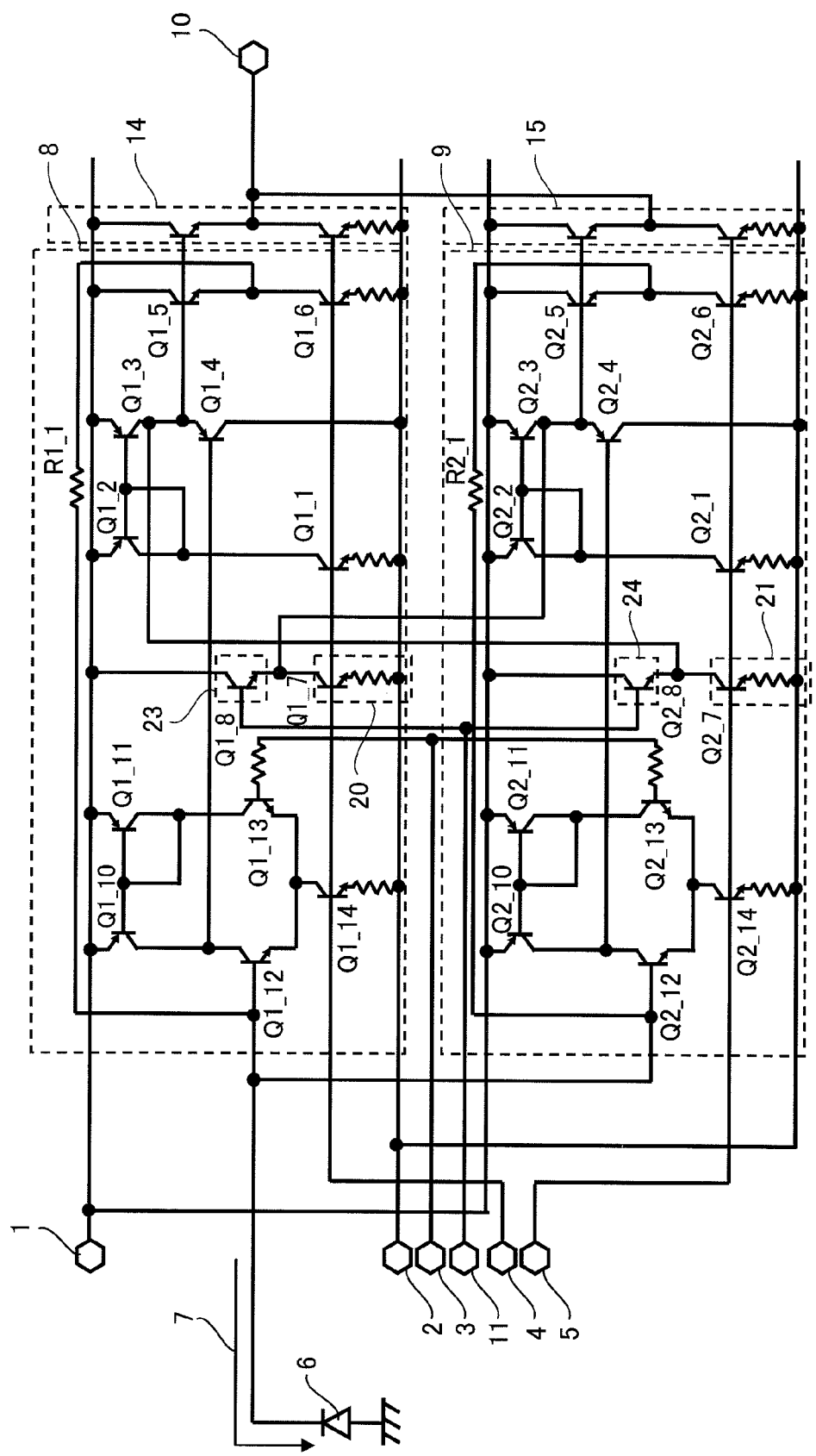
FIG. 1 is a circuit diagram showing a configuration of a light receiving circuit in accordance with a first exemplary embodiment of the present invention.

Firstly, a configuration of a light receiving circuit in accordance with this exemplary embodiment of the present invention is explained with reference to FIG. 1. FIG. 1 is a circuit diagram showing a configuration of a light receiving circuit in accordance with this exemplary embodiment.

The light receiving circuit includes I-V conversion amplifiers 8 and 9 having different I-V conversion gains. Each of the I-V conversion amplifiers 8 and 9 is a current-voltage conversion circuit to convert a current signal to a voltage signal. A common photodiode 6 is connected to the input sides of the I-V conversion amplifiers 8 and 9. The photodiode 6 is a light-sensitive element to convert an optical input signal to an electrical current signal. The buffer circuits 14 and 15 are connected to the output sides of the I-V conversion amplifiers 8 and 9 respectively. Further, a common output terminal 10 is connected to the I-V conversion amplifiers 8 and 9 through respective buffer circuits 14 and 15. By connecting the I-V conversion amplifiers 8 and 9 to the common output terminal 10 through the respective buffer circuits 14 and 15, the output from each of the I-V conversion amplifiers 8 and 9 is prevented from flowing into the output terminal of the other one of the I-V conversion amplifiers 8 and 9.

Power-supply voltage terminals 1, 2, 3 and 11 are also connected to the I-V conversion amplifiers 8 and 9. A power-supply voltage Vcc, a ground voltage GND, a first reference voltage Vref, and a second reference voltage Vref2 are supplied through the power-supply voltage terminals 1, 2, 3 and 11 respectively. Further, a bias terminal 4 is connected to the I-V conversion amplifier 8. Meanwhile, a bias terminal 5 is connected to the I-V conversion amplifier 9.

By the bias voltages supplied through the bias terminals 4 and 5, either one of the I-V conversion amplifiers 8 and 9 can be brought into an operating state (On) and the other one can be brought into a non-operating state (Off). That is, switching can be performed between the I-V conversion amplifiers 8 and 9. Specifically, by supplying a selection voltage and a non-selection voltage to the bias terminals 4 and 5 respectively, the I-V conversion amplifier 8 can be turned on and the I-V conversion amplifier 9 can be turned off. Hereinafter, a state in which a selection voltage is supplied to the bias terminal 4 or 5 may be described as "bias terminal 4 or 5 is turned on". Further, a state in which a non-selection voltage is supplied to the bias terminal 4 or 5 may be described as "bias terminal 4 or 5 is turned off".

A current signal from the photodiode 6 is input to the I-V conversion amplifiers 8 and 9. Only one of the I-V conversion amplifiers 8 and 9 is in an On-state. Therefore, the current signal from the photodiode 6 is converted by the I-V conversion amplifier 8 or the I-V conversion amplifier 9 and is output from the output terminal 10 through the buffer circuit 14 or the buffer circuit 15.

A configuration of the I-V conversion amplifier 8 is explained hereinafter. A differential amplification circuit is provided in the input stage of the I-V conversion amplifier 8.

The differential amplification circuit includes a current mirror circuit composed of pnp-type transistors Q1_10 and Q1_11. Further, the differential amplification circuit includes a differential pair composed of npn-type transistors Q1_12 and Q1_13. The power-supply voltage Vcc is supplied to the emitters of the transistors Q1_10 and Q1_11 through the power-supply voltage terminal 1. Further, the collectors of the transistors Q1_12 and Q1_13 are connected to the collectors of the transistors Q1_10 and Q1_11 respectively.

Further, the base of the transistor Q1_4 is connected to the collectors of the transistors Q1_10 and Q1_12. That is, the output from the differential amplification circuit is input to the transistor Q1_4. Further, the feedback resistor R1_1 and the photodiode 6 are connected to the base of the transistor Q1_12. The feedback resistor R1_1 is connected to the emitter of the transistor Q1_5, and connected to the collectors of the transistors Q1_10 and Q1_12 through the transistors Q1_4 and Q1_5. Note that a part of the light input current 7 flows to the photodiode 6 through the feedback resistor R1_1. Further, the base of the transistor Q2_12 and the feedback resistor R2_1 of the I-V conversion amplifier 9 are also connected to the base of the transistor Q1_12.

Furthermore, the emitters of the transistors Q1_12 and Q1_13, which constitute the differential pair, are connected together. The collector of an npn-type transistor Q1_14 is connected to the emitters of the transistors Q1_12 and Q1_13. Further, the power-supply voltage terminal 3 is connected to the base of the transistor Q1_13 through a resistor. A reference voltage Vref is supplied through the power-supply voltage terminal 3. With the configuration like this, the differential amplification circuit amplifies a difference between inputs to the bases of the transistors Q1_12 and Q1_13. That is, the difference between the voltage corresponding to the current signal from the photodiode 6 and the reference voltage Vref is amplified.

A current mirror circuit composed of pnp-type transistors Q1_2 and Q1_3 is provided in the output stage of the I-V conversion amplifier 8. The power-supply voltage Vcc is supplied to the emitters of the transistors Q1_2 and Q1_3 through the power-supply voltage terminal 1. The collector of the transistors Q1_1 is connected to the collector of the transistor Q1_2. The emitter of a pnp-type transistor Q1_4 and the base of an npn-type transistor Q1_5 are connected to the collector of the transistor Q1_3. Further, the collector of the transistor Q2_7 and the emitter of the transistor Q2_8 of the I-V conversion amplifier 9 are connected to the collector of the transistor Q1_3.

Furthermore, the ground voltage GND is supplied to the collector of the transistor Q1_4 through the power-supply voltage terminal 2. The power-supply voltage Vcc is supplied to the collector of the transistor Q1_5 through the power-supply voltage terminal 1. The feedback resistor R1_1 and the collector of an npn-type transistor Q1_6 are connected to the emitter of the transistor Q1_5.

Further, the I-V conversion amplifier 8 includes a transient current processing circuit 20 composed of an npn-type transistor Q1_7, and a clipping circuit 23 composed of an npn transistor Q1_8. The transient current processing circuit 20 draws in a transient current from the I-V conversion amplifier 9. Specifically, the transient current processing circuit 20 processes a transient current from the I-V conversion amplifier 9 when the I-V conversion amplifier 9 is switched from an On-state to an Off-state. The clipping circuit 23 is a circuit to keep the voltage of the input terminal of the transient current processing circuit 20, i.e., transistor Q1_7 at a predetermined value. In this way, the saturated operation of the transistor Q1_7 is suppressed.

The emitter of the transistor Q1_8 is connected to the collector of the transistor Q1_7. The collector of the transistor Q2_3 of the I-V conversion amplifier 9 is connected to the collector of the transistor Q1_7 and the emitter of the transistor Q1_8. In this way, a transient current from the I-V conversion amplifier 9 is supplied to the collector of the transistor Q1_7 when the I-V conversion amplifier 8 is in an On-state and the I-V conversion amplifier 9 is in an Off-state.

A reference voltage Vref2 is supplied to the base of the transistor Q1_8 through the power-supply voltage terminal 11. The power-supply voltage Vcc is supplied to the collector of the transistor Q1_8 through the power-supply voltage terminal 1. With the configuration like this, the transistor Q1_8 is turned off when the transient current is processed, and is automatically turned on after the transient current process. Then, a current flows from the emitter of the transistor Q1_8 to the collector of the transistor Q1_7. In this way, the voltage of the input terminal of the transistor Q1_7 is kept at a predetermined value.

Further, the I-V conversion amplifier 8 includes a constant current circuit composed of transistors Q1_1, Q1_6, Q1_7 and Q1_14. The bias terminal 4 is connected to the bases of the transistors Q1_1, Q1_6, Q1_7 and Q1_14. That is, by the bias voltage applied to the bias terminal 4, On/Off states of the transistors Q1_1, Q1_6, Q1_7 and Q1_14 can be switched. In this way, the On/Off state of the I-V conversion amplifier 8 can be switched. The power-supply voltage terminal 2 is connected to the emitters of the transistors Q1_1, Q1_6, Q1_7 and Q1_14 through respective resistors. The ground voltage GND is supplied from the power-supply voltage terminal 2.

Next, a configuration of the I-V conversion amplifier 9 is explained. The I-V conversion amplifier 9 has roughly the same circuit configuration as that of the I-V conversion amplifier 8. Note that for corresponding transistors between the I-V conversion amplifier 8 and the I-V conversion amplifier 9, the same numbers are assigned and added to the signs "Q1_" and "Q2_". Further, the bias terminal 5 is connected to the bases of the transistors Q2_1, Q2_6, Q2_7 and Q2_14. That is, by the bias voltage applied to the bias terminal 5, the On/Off states of the transistors Q2_1, Q2_6, Q2_7 and Q2_14 can be switched. In this way, the On/Off state of the I-V conversion amplifier 9 can be switched.

Further, the I-V conversion amplifier 9 includes a transient current processing circuit 21 composed of a transistor Q2_7, and a clipping circuit 24 composed of an npn transistor Q2_8. The transient current processing circuit 21 processes a transient current from the I-V conversion amplifier 8 when the I-V conversion amplifier 8 is switched from an On-state to an Off-state. The clipping circuit 24 is a circuit to keep the voltage of the input terminal of the transient current processing circuit 21, i.e., transistor Q2_7 at a predetermined value.

The emitter of the npn-type transistor Q2_8 is connected to the collector of the transistor Q2_7. The collector of the transistor Q1_3 of the I-V conversion amplifier 8 is connected to the collector of the transistor Q2_7 and the emitter of the transistor Q2_8. In this way, a transient current from the I-V conversion amplifier 8 is supplied to the collector of the transistor Q2_7 when the I-V conversion amplifier 8 is in an Off-state and the I-V conversion amplifier 9 is in an On-state. Further, when this transient current becomes smaller, the transistor Q2_8 is turned on and a current thereby flows from the emitter of the transistor Q2_8 to the collector of the transistor Q2_7. The light receiving circuit in accordance with this exemplary embodiment has the configuration described above.

Next, operations of the above-described light receiving circuit are explained. As a specific example, a case where the bias terminal 4 is changed from an Off-state to an On-state and the bias terminal 5 is changed from an On-state to an Off-state in FIG. 1 is explained hereinafter. That is, an operation at the moment at which the I-V conversion amplifier 8 is changed from an Off-state to an On-state and the I-V conversion amplifier 9 is changed from an On-state to an Off-state is explained.

The transistor Q2_3 constitutes a current mirror circuit with the transistor Q2_2. Therefore, when the bias terminal 5 is turned off, the transistor Q2_2 is turned off and the transistor Q2_3 is thereby also turned off. At this point, the transient current of the transistor Q2_3 flows from the collector of the transistor Q2_3 to the collector of the transistor Q1_7. That is, when the transistor Q2_3 is turned off, a constant current operation is carried out by using the bias voltage on the turning-on side. In this way, the transient current of the transistor Q2_3 is processed and the transistor Q2_3 thereby can be swiftly turned off.

That is, since the transistor Q2_4 is turned off, the transient current of the transistor Q2_3 does not flow as the base current of the transistor Q2_5. In other words, no transient current flows to the I-V conversion amplifier 8 through the transistor Q2_5 and the feedback resistor R2_1. In this way, the effect on the I-V conversion amplifier 8 can be suppressed.

Further, an appropriate potential (e.g., around reference voltage Vref) is supplied to the base of the transistor Q1_8 through the power-supply voltage terminal 11. In this way, the transistor Q1_8 is turned off when the transient current of the transistor Q2_3 is processed. Further, after the transient current process, the transistor Q1_8 is automatically turned on to form a current supply path to the transient current processing circuit 20. In this way, the drop in the collector potential of the transistor Q1_7 is suppressed, and it is thereby possible to prevent the transistor Q1_7 from performing the saturated operation.

Figure 2:
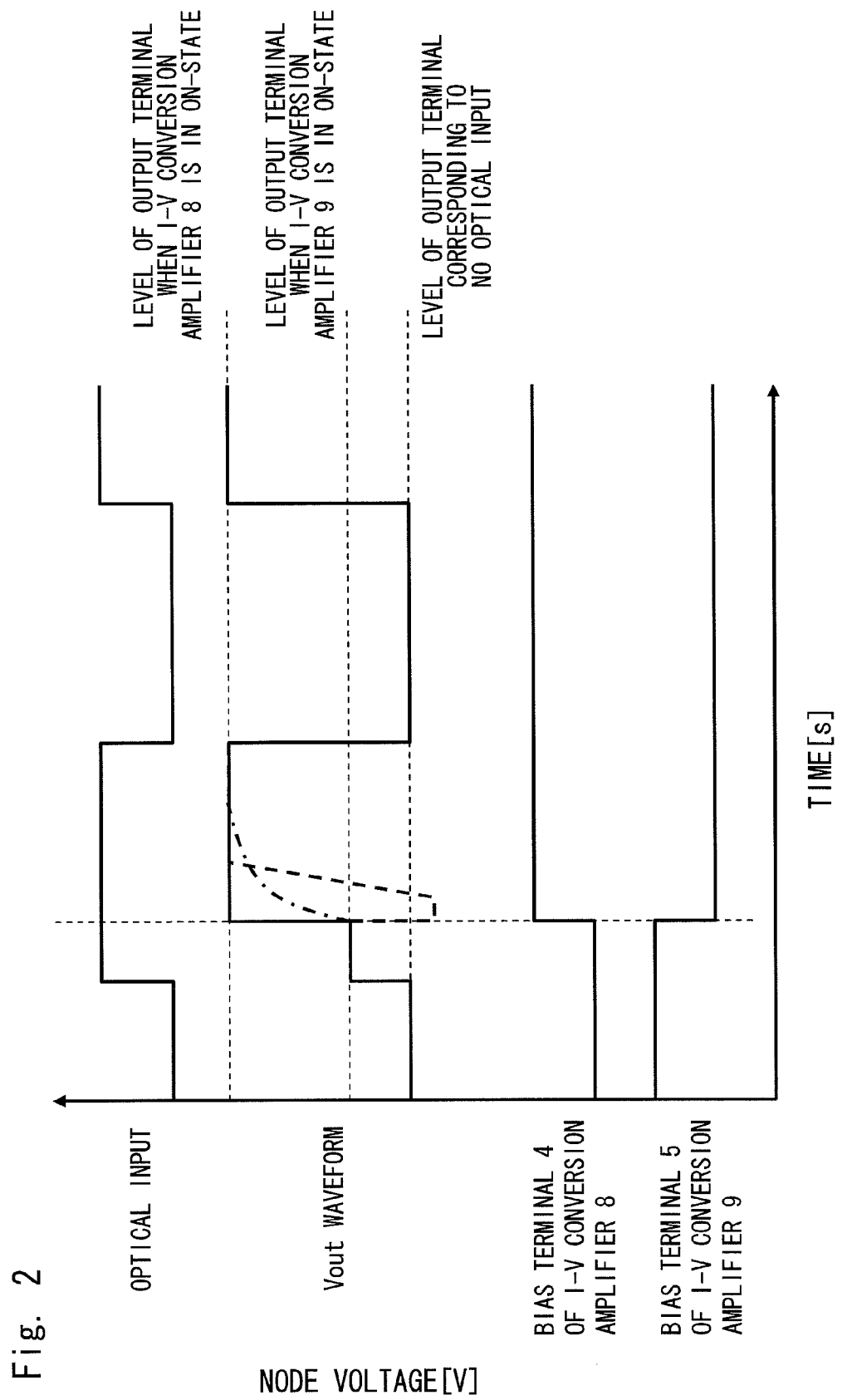
FIG. 2 is a graph for comparing output waveforms from output terminals of I-V conversion amplifiers in accordance with an exemplary aspect of the present invention and in publicly-known techniques.

FIG. 2 is a graph for comparing output waveforms from output terminals 10 when switching is performed between the I-V conversion amplifiers 8 and 9 in accordance with an exemplary aspect of the present invention and in publicly-known techniques. FIG. 2 shows, from top to bottom, an optical output, Vout waveforms (output waveforms), voltage of the bias terminal 4, and voltage of the bias terminal 5. Further, for the Vout waveforms, the dashed dotted line, the dotted line, and the solid line indicate Vout waveforms of Publicly-known technique 1, Publicly-known technique 2, and (an exemplary aspect of) the present invention respectively.

As shown in FIG. 2, in Publicly-known techniques 1 and 2, the Vout waveforms have a blunted shape or a grooved shape. That is, an abnormality occurs in their waveforms. By contrast, in an exemplary aspect of the present invention, when switching from the I-V conversion amplifier 9 to the I-V conversion amplifier 8 occurs, the output terminal level is swiftly switched from the one in the state where the I-V conversion amplifier 9 is in an On-state to the one in the state where the I-V conversion amplifier 8 is in an On-state. That is, substantially no abnormality occurs in the waveform, thus demonstrating that the output characteristics are improved.

As has been described above, in this exemplary embodiment of the present invention, the transient current processing circuit 20 of the I-V conversion amplifier 8 is connected to the transistor Q2_3 of the I-V conversion amplifier 9. That is, when the I-V conversion amplifier 9 is turned off, the transistor Q2_3 enters a state where the transistor Q2_3 is connected to the constant current circuit (transient current processing circuit 20) that operates by the bias voltage used to bring the I-V conversion amplifier 8 into an On-state. In this way, the transient current of the transistor Q2_3 is swiftly processed and the transistor Q2_3 is thereby swiftly turned off. Further, the clipping circuit 23 is connected to the transient current processing circuit 20. The clipping circuit 23 is used to form a current path to the transient current processing circuit 20 after the transient current process. In this way, the saturated operation of the transient current processing circuit 20 can be suppressed, and the effect on the output characteristics is thereby reduced. Further, the transistor Q1_3 works in a similar manner, and the effect on the output characteristics is thereby reduced. As a result, excellent switching characteristics are obtained.

Note that the transient current processing circuit 20 and the clipping circuit 23 are provided in the I-V conversion amplifier 8 and the transient current processing circuit 21 and the clipping circuit 24 are provided in the I-V conversion amplifier 9. That is, the transient current processing circuit and the clipping circuit are provided on both I-V conversion amplifiers 8 and 9. However, the present invention is not limited to the configuration like this. These circuits may be provided in either one of the I-V conversion amplifiers 8 and 9. Further, although a light receiving circuit including two I-V conversion amplifiers 8 and 9 is explained above, the present invention can be also applied to a light receiving circuit including only one I-V conversion amplifier. Even in such cases, the transient current that is generated when the I-V conversion amplifier is turned off can be swiftly processed. Therefore, if the I-V conversion amplifier is turned on after that, substantially no abnormality occurs in the Vout waveform, thus improving the output characteristics.

Second Exemplary Embodiment

Figure 3:
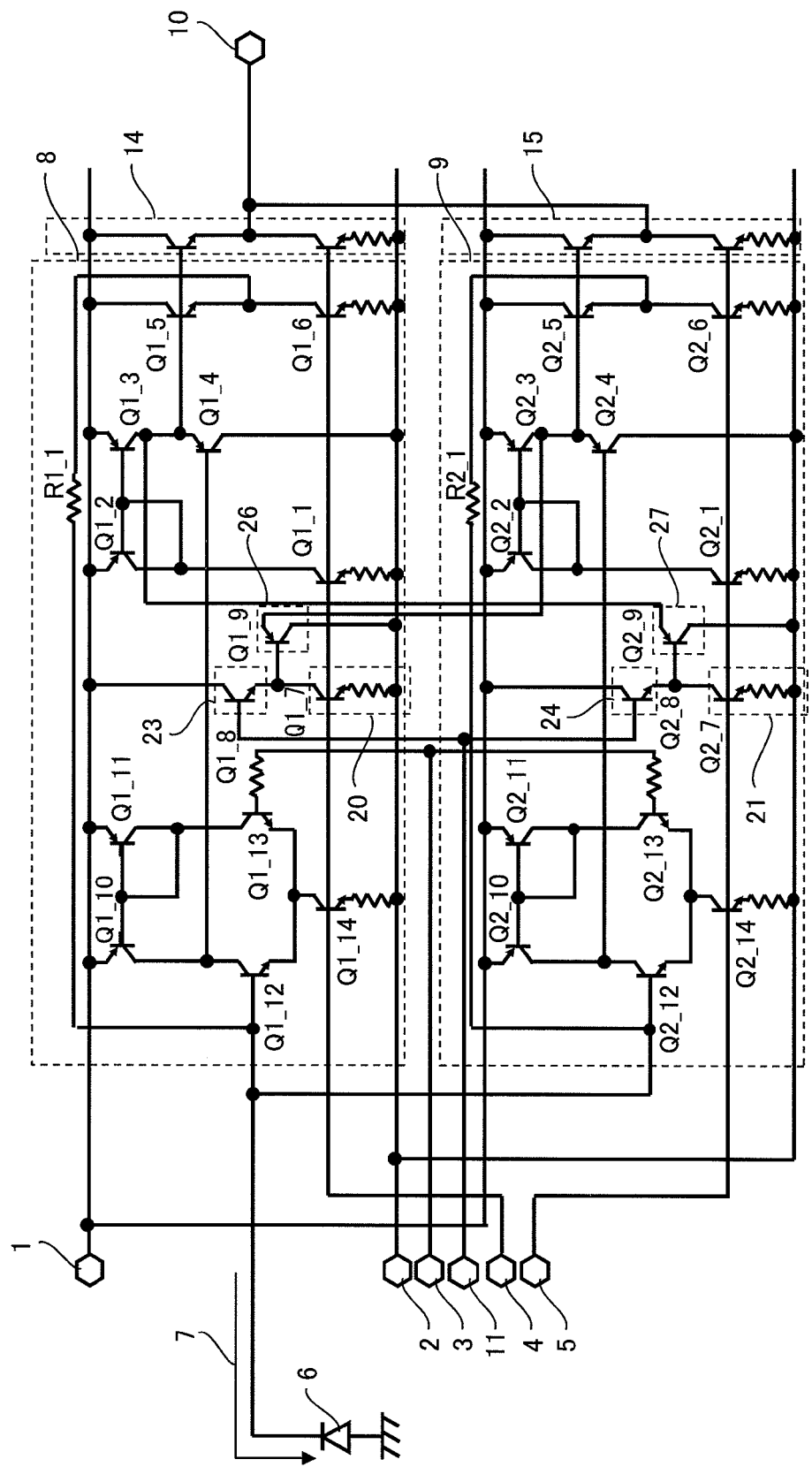
FIG. 3 is a circuit diagram showing a configuration of a light receiving circuit in accordance with a second exemplary embodiment of the present invention.

A light receiving circuit in accordance with this exemplary embodiment of the present invention includes level shift circuits 26 and 27. Note that the fundamental configuration and the like are similar to those of the first exemplary embodiment, and therefore explanation thereof are omitted or simplified. Firstly, a configuration of a light receiving circuit in accordance with this exemplary embodiment is explained with reference to FIG. 3. FIG. 3 is a circuit diagram showing a configuration of a light receiving circuit in accordance with this exemplary embodiment.

The I-V conversion amplifier 8 includes a level shift circuit 26 composed of a pnp-type transistor Q1_9. The level shift circuit 26 is disposed at a subsequent stage to the transient current processing circuit 20 and the clipping circuit 23. The emitter of the transistor Q1_8 and the collector of the transistor Q1_7 are connected to the base of the transistor Q1_9. The collector of the transistor Q2_3 is connected to the emitter of the transistor Q1_9. The ground voltage GND is supplied to the collector of the transistor Q1_9 through the power-supply voltage terminal 2. While the collector of the transistor Q1_7 and the emitter of the transistor Q1_8 are directly connected to the collector of the transistor Q2_3 in the first exemplary embodiment, they are connected through the transistor Q1_9 in this second exemplary embodiment.

The I-V conversion amplifier 9 includes a level shift circuit 27 composed of a pnp-type transistor Q2_9. The level shift circuit 27 is disposed at a subsequent stage to the transient current processing circuit 21 and the clipping circuit 24. The emitter of the transistor Q2_8 and the collector of the transistor Q2_7 are connected to the base of the transistor Q2_9. The collector of the transistor Q1_3 is connected to the emitter of the transistor Q2_9. The ground voltage GND is supplied to the collector of the transistor Q2_9 through the power-supply voltage terminal 2. While the collector of the transistor Q2_7 and the emitter of the transistor Q2_8 are directly connected to the collector of the transistor Q1_3 in the first exemplary embodiment, they are connected through the transistor Q2_9 in this second exemplary embodiment.

In the configuration of the first exemplary embodiment shown in FIG. 1, when the light input current 7 is absent, the voltage of the output terminal 10 becomes the reference voltage Vref. Meanwhile, when the transistor Q1_5 is in an Off-state, the base of the transistor Q1_5 is clipped at a potential that is different from the reference voltage Vref2 by a base-emitter voltage (hereinafter called "VBE") by the transistors Q2_7 and Q2_8. Similarly, when the transistor Q2_5 is in an Off-state, the base of the transistor Q2_5 is clipped at a potential that is different from the reference voltage Vref2 by a base-emitter voltage (VBE) by the transistors Q1_7 and Q1_8. Note that when the reference voltage Vref and the reference voltage Vref2 are at the same potential, a reverse bias equivalent to a VBE of a transistor is applied between the emitter and base of the transistors Q1_5 and Q2_5.

In contrast to this, the light receiving circuit in accordance with this exemplary embodiment includes level shift circuits 26 and 27 as shown in FIG. 3. Further, a potential level is shifted by the level shift circuit 26 or 27. Specifically, a voltage obtained by shifting the voltage level of the input terminal of the transient current processing circuit 20 or 21 by the level shift circuit 26 or 27 is supplied to the output terminal of the transient current. That is, a voltage of a value that is level-shifted from a predetermined value is supplied to the output terminal of the transient current. In this way, the clipping potential of the bases of the transistor Q1_5 or Q2_5 connected to this output terminal can be made substantially equal to the reference voltage Vref2. Further, the reverse bias can be prevented from being applied. In this way, the reliability of the transistors in a situation where the gain switching is repeatedly performed is expected to improve.

Third Exemplary Embodiment

Figure 4:
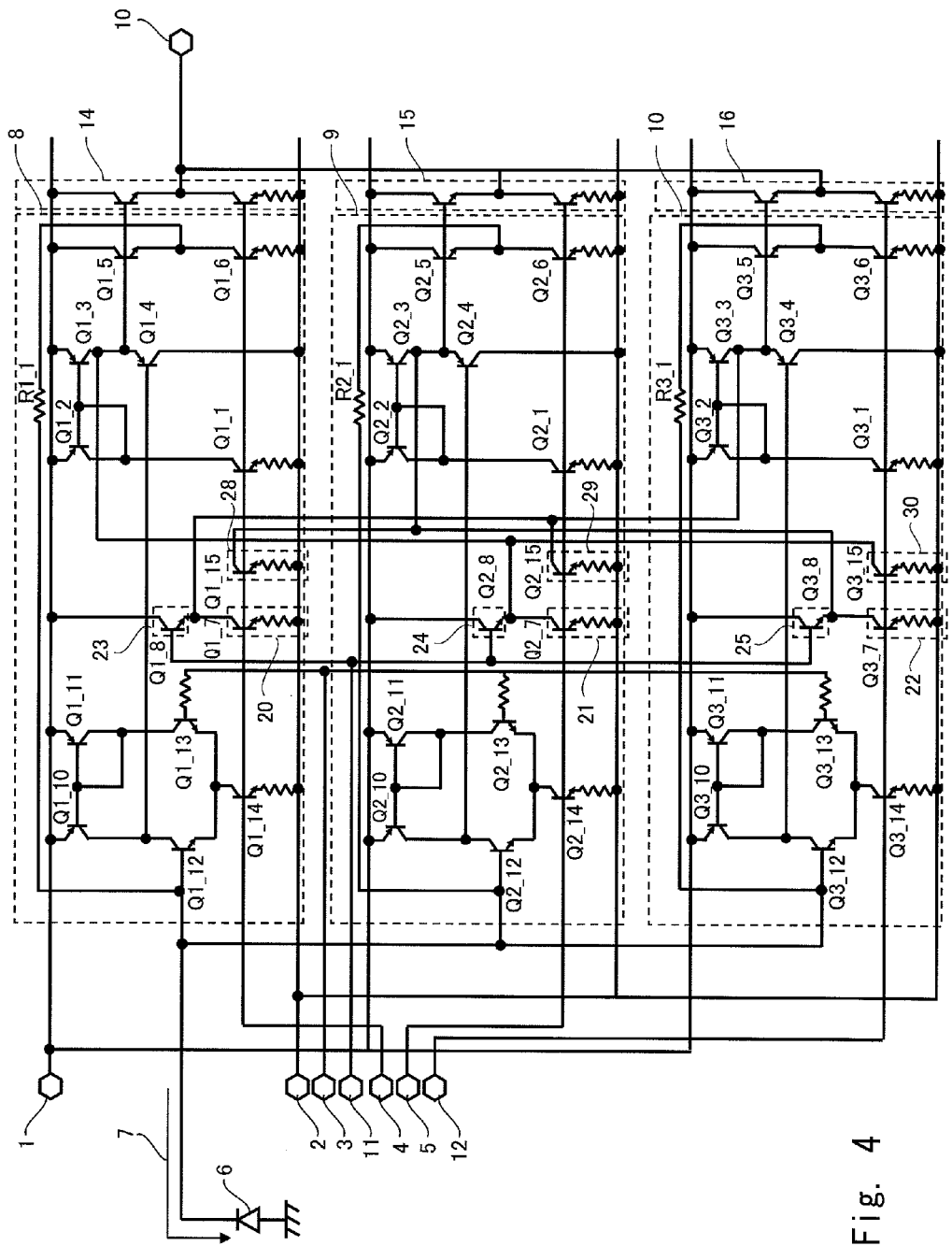
FIG. 4 is a circuit diagram showing a configuration of a light receiving circuit in accordance with a third exemplary embodiment of the present invention.
Figure 5:
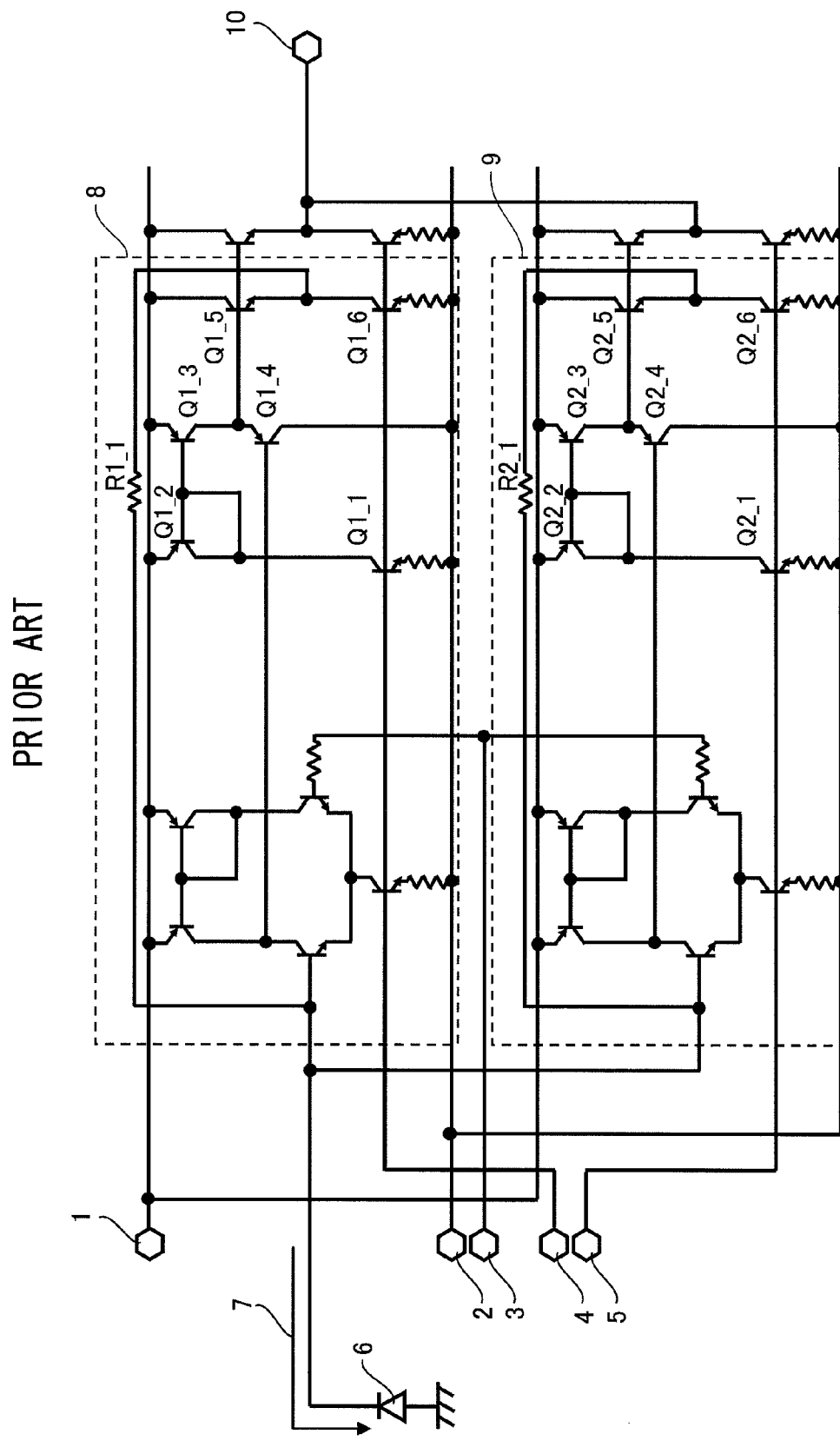
FIG. 5 is a circuit diagram showing a configuration of a light receiving circuit in Publicly-known technique 1.
Figure 6:
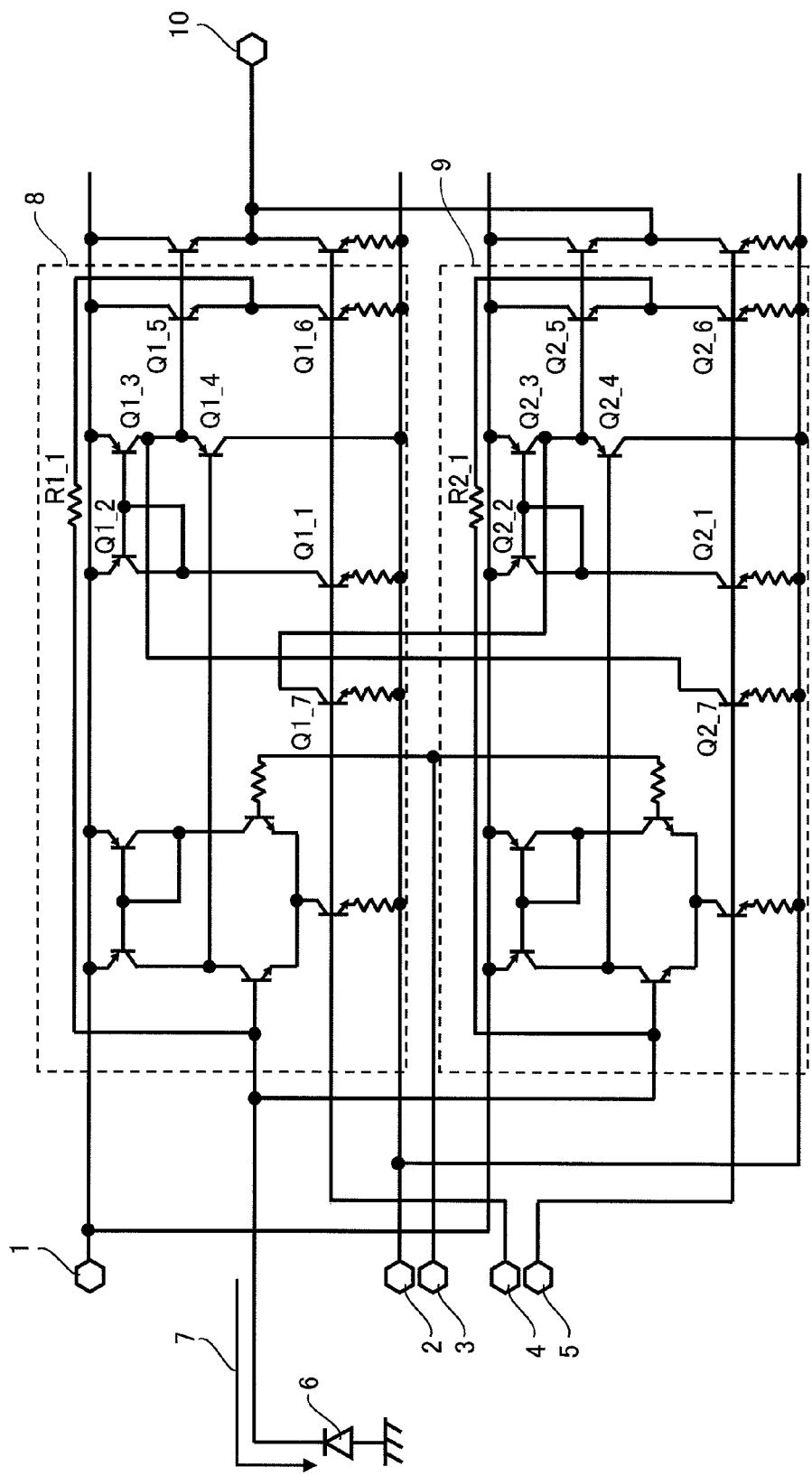
FIG. 6 is a circuit diagram showing a configuration of a light receiving circuit in Publicly-known technique 2.

A light receiving circuit in accordance with this exemplary embodiment of the present invention includes three I-V conversion amplifiers 8, 9 and 10. Note that the fundamental configuration and the like are similar to those of the first exemplary embodiment, and therefore explanation thereof are omitted or simplified. Firstly, a configuration of a light receiving circuit in accordance with this exemplary embodiment is explained with reference to FIG. 4. FIG. 4 is a circuit diagram showing a configuration of a light receiving circuit in accordance with this exemplary embodiment.

As shown in FIG. 4, three I-V conversion amplifiers 8, 9 and 10, which are roughly the same circuit configuration as each other, are provided in the light receiving circuit. A bias terminal 12 is connected to the I-V conversion amplifier 10. By bias voltages supplied from the bias terminals 4, 5 and 12, only one of the I-V conversion amplifiers 8, 9 and 10 can be selectively turned on and the other I-V conversion amplifiers can be turned off. That is, switching can be performed among the I-V conversion amplifiers 8, 9 and 10 having different I-V conversion gains. Specifically, by supplying a selection voltage to the bias terminal 4 and supplying a non-selection voltage to the bias terminals 5 and 12, only the I-V conversion amplifier 8 can be turned on and the I-V conversion amplifiers 9 and 10 can be turned off.

The I-V conversion amplifier 8 in accordance with this exemplary embodiment has such a configuration that another transient current processing circuit 28 composed of an npn-type transistor Q1_15 is added to the I-V conversion amplifier 8 shown in FIG. 1. The transient current processing circuit 28 is a circuit to process a transient current from the I-V conversion amplifier 9 when the I-V conversion amplifier 9 is switched from an On-state to an Off-state. The power-supply voltage terminal 2 is connected to the emitter of the transistor Q1_15 through a resistor. A ground voltage GND is supplied through the power-supply voltage terminal 2. The collectors of the transistors Q2_3 and Q3_7 and the emitter of the transistor Q3_8 are connected to the collector of the transistor Q1_15.

A bias voltage is supplied to the base of the transistor Q1_15 through the bias terminal 4. That is, by the bias voltage applied to the bias terminal 4, the On/Off state of the transistor Q1_15 can be switched. In this way, a transient current from the transistor Q2_3 of the I-V conversion amplifier 9 is supplied to the collector of the transistor Q1_15 when the I-V conversion amplifier 8 is in an On-state and the I-V conversion amplifiers 9 and 10 are in an Off-state.

A current is supplied from the emitter of the transistor Q3_8, which constitutes a clipping circuit 25, to the collector of the transistor Q1_15. That is, the voltage of the input terminal of the transient current processing circuit 28 is kept at a predetermined value by the clipping circuit 25. In this way, the saturated operation of the transistor Q1_15 can be suppressed.

Further, the transient current processing circuit 20 processes a transient current from the I-V conversion amplifier 10 when the I-V conversion amplifier 10 is switched from an On-state to an Off-state. That is, a transient current from the transistor Q3_3 of the I-V conversion amplifier 10 is supplied to the collector of the transistor Q1_7 when the I-V conversion amplifier 8 is in an On-state and the I-V conversion amplifiers 9 and 10 are in an Off-state. As described above, the I-V conversion amplifier 8, which is turned on by a bias voltage from the bias terminal 4, includes transient current processing circuits, each of which is turned on by the bias voltage from the bias terminal 4 and corresponds to the respective one of the I-V conversion amplifiers other than the I-V conversion amplifier 8. In this way, transient currents from the transistors Q2_3 and Q3_3 can be processed, and the transistors Q2_3 and Q3_3 thereby can be swiftly turned off.

Further, a pair of a transient current processing circuit 20 and a clipping circuit 23 may be disposed within the same I-V conversion amplifier 8 as in the case of the transistors Q1_7 and Q1_8. Alternatively, a pair of a transient current processing circuit 28 and a clipping circuit 25 may be disposed in different I-V conversion circuits as in the case of the transistors Q1_15 and Q3_8.

Similarly to the examples described above, the I-V conversion amplifier 9 includes two transient current processing circuits 21 and 29. The transient current processing circuit 29 is composed of an npn-type transistor Q2_15. The transient current processing circuit 29 is a circuit to process a transient current from the I-V conversion amplifier 10 when the I-V conversion amplifier 10 is switched from an On-state to an Off-state. The power-supply voltage terminal 2 is connected to the emitter of the transistor Q2_15 through a resistor. A ground voltage GND is supplied through the power-supply voltage terminal 2. The collectors of the transistors Q3_3 and Q1_7 and the emitter of the transistor Q1_8 are connected to the collector of the transistor Q2_15.

A bias voltage is supplied to the base of the transistor Q2_15 through the bias terminal 5. That is, by the bias voltage applied to the bias terminal 5, the On/Off state of the transistor Q2_15 can be switched. In this way, a transient current from the transistor Q3_3 of the I-V conversion amplifier 10 is supplied to the collector of the transistor Q2_15 when the I-V conversion amplifier 9 is in an On-state and the I-V conversion amplifiers 8 and 10 are in an Off-state.

A current is supplied from the emitter of the transistor Q1_8, which constitutes a clipping circuit 23, to the collector of the transistor Q2_15. That is, the voltage of the input terminal of the transient current processing circuit 29 is kept at a predetermined value by the clipping circuit 23. In this way, the saturated operation of the transistor Q2_15 can be suppressed.

The transient current processing circuit 21 processes a transient current from the I-V conversion amplifier 8 when the I-V conversion amplifier 8 is switched from an On-state to an Off-state. That is, a transient current from the transistor Q1_3 of the I-V conversion amplifier 8 is supplied to the collector of the transistor Q2_7 when the I-V conversion amplifier 9 is in an On-state and the I-V conversion amplifiers 8 and 10 are in an Off-state.

Similarly to the examples described above, the I-V conversion amplifier 10 includes two transient current processing circuits 22 and 30. The transient current processing circuit 30 is composed of an npn-type transistor Q3_15. The transient current processing circuit 30 is a circuit to process a transient current from the I-V conversion amplifier 8 when the I-V conversion amplifier 8 is switched from an On-state to an Off-state. The power-supply voltage terminal 2 is connected to the emitter of the transistor Q3_15 through a resistor. A ground voltage GND is supplied through the power-supply voltage terminal 2. The collectors of the transistors Q1_3 and Q2_7 and the emitter of the transistor Q2_8 are connected to the collector of the transistor Q3_15.

A bias voltage is supplied to the base of the transistor Q3_15 through the bias terminal 12. That is, by the bias voltage applied to the bias terminal 12, the On/Off state of the transistor Q3_15 can be switched. In this way, a transient current from the transistor Q1_3 of the I-V conversion amplifier 8 is supplied to the collector of the transistor Q3_15 when the I-V conversion amplifier 10 is in an On-state and the I-V conversion amplifiers 8 and 9 are in an Off-state.

A current is supplied from the emitter of the transistor Q2_8, which constitutes a clipping circuit 24, to the collector of the transistor Q3_15. That is, the voltage of the input terminal of the transient current processing circuit 30 is kept at a predetermined value by the clipping circuit 24. In this way, the saturated operation of the transistor Q3_15 can be suppressed.

The transient current processing circuit 22 processes a transient current from the I-V conversion amplifier 9 when the I-V conversion amplifier 9 is switched from an On-state to an Off-state. That is, a transient current from the transistor Q2_3 of the I-V conversion amplifier 9 is supplied to the collector of the transistor Q3_7 when the I-V conversion amplifier 10 is in an On-state and the I-V conversion amplifiers 8 and 9 are in an Off-state.

A case like this exemplary embodiment in which three I-V conversion amplifiers 8, 9 and 10 are provided also has similar advantageous effects to those of the first exemplary embodiment. Needless to say, the number of I-V conversion amplifiers is not limited to three, and four or more than four I-V conversion amplifiers may be provided. Further, above-described exemplary embodiments may be combined with each other as appropriate. For example, a level shift circuit(s) may be added to the light receiving circuit shown in FIG. 4. The present invention is not limited to above-described exemplary embodiments, and various modifications can be possible without departing from the spirit of the present invention.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A light receiving circuit comprising:
    a light-sensitive element that converts an optical input signal into a current signal;
    a first current-voltage conversion circuit that converts the current signal to a voltage signal;
    a first transient current processing circuit that processes a transient current from the first current-voltage conversion circuit when the first current-voltage conversion circuit is switched from an operating state to a non-operating state; and
    a first clipping circuit that keeps a voltage of an input terminal of the first transient current processing circuit at a predetermined value.

2. The light receiving circuit according to claim 1, further comprising:
    a second current-voltage conversion circuit that converts the current signal to a voltage signal;
    a second transient current processing circuit that processes a transient current from the second current-voltage conversion circuit when the second current-voltage conversion circuit is switched from an operating state to a non-operating state; and
    a second clipping circuit that keeps a voltage of an input terminal of the second transient current processing circuit at a predetermined value.

3. The light receiving circuit according to claim 2, wherein either one of the first and second current-voltage conversion circuits is selectively brought into an operating state by supplying a bias voltage,
    the first transient current processing circuit operates by a bias voltage used to bring the second current-voltage circuit into an operating state, and
    the second transient current processing circuit operates by a bias voltage used to bring the first current-voltage circuit into an operating state.

4. The light receiving circuit according to claim 2, further comprising a level shift circuit disposed at a subsequent stage to at least one of the first and second transient current processing circuits, the level shift circuit being configured to supply a voltage of a value obtained by shifting a level of the predetermined value to an output terminal of a transient current.

5. A light receiving circuit comprising:
    a first current-voltage conversion circuit that converts a current signal generated with a light-sensitive element to a voltage signal;
    a second current-voltage conversion circuit that converts a current signal generated with a light-sensitive element to a voltage signal;
    a first transient current processing circuit that processes a transient current from the second current-voltage conversion circuit when the second current-voltage conversion circuit is switched from an operating state to a non-operating state; and a first clipping circuit that keeps a voltage of an input terminal of the first transient current processing circuit at a predetermined value;

wherein the first transient current processing circuit and the first clipping circuit are located in the second current-voltage conversion circuit.

6. A light receiving circuit comprising:

a first current-voltage conversion circuit that converts a current signal generated with a light-sensitive element to a voltage signal;

a second current-voltage conversion circuit that converts the current signal to a voltage signal, either one of the first and second current-voltage conversion circuits being capable of being selectively brought into an operating state, a first transient current processing circuit that processes a transient current from the second current-voltage conversion circuit when the second current-voltage conversion circuit is switched from an operating state to a non-operating state; and a first clipping circuit that keeps a voltage of an input terminal of the first transient current processing circuit at a predetermined value, wherein the first transient current processing circuit and the first clipping circuit are located in the first current-voltage conversion circuit.

7. The light receiving circuit according to claim 6 further comprising:

a second transient current processing circuit that processes a transient current from the first current-voltage conversion circuit when the first current-voltage conversion circuit is switched from an operating state to a non-operating state; and a second clipping circuit that keeps a voltage of an input terminal of the second transient current processing circuit at a predetermined value, wherein the second transient current processing circuit and the second clipping circuit are formed in the first current-voltage conversion circuit.

* * * * *